United States Patent
Song et al.

(10) Patent No.: US 7,436,468 B2
(45) Date of Patent: Oct. 14, 2008

(54) LIQUID CRYSTAL DISPLAY HAVING AN LED AND A THERMAL CONDUCTIVE SHEET

(75) Inventors: Chun-ho Song, Seoul (KR); Seock-hwan Kang, Suwon-si (KR); Gi-cherl Kim, Yongin-si (KR); Sang-yu Lee, Yongin-si (KR); Joo-woan Cho, Seoul (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 412 days.

(21) Appl. No.: 11/377,260

(22) Filed: Mar. 16, 2006

(65) Prior Publication Data

US 2006/0221574 A1    Oct. 5, 2006

(30) Foreign Application Priority Data

Mar. 29, 2005    (KR) ...................... 10-2005-0025931

(51) Int. Cl.
G02F 1/1335    (2006.01)
H05K 7/20    (2006.01)

(52) U.S. Cl. ............................. 349/61; 349/62; 361/704
(58) Field of Classification Search ................... 349/61, 349/62; 361/704
See application file for complete search history.

(56) References Cited

U.S. PATENT DOCUMENTS

| 7,164,224 | B2 * | 1/2007 | Hayashi et al. | 313/27 |
| 2007/0019419 | A1 * | 1/2007 | Hafuka et al. | 362/373 |
| 2007/0030697 | A1 * | 2/2007 | Kim | 362/618 |
| 2007/0041212 | A1 * | 2/2007 | Cho et al. | 362/561 |
| 2007/0091588 | A1 * | 4/2007 | Hwang | 362/97 |

* cited by examiner

Primary Examiner—Mike Qi
(74) Attorney, Agent, or Firm—F. Chau & Associates, LLC

(57) ABSTRACT

According to an embodiment of the present invention, an LCD comprises a liquid crystal display panel, an LED circuit board disposed behind the liquid crystal display panel, wherein a plurality of LEDs are disposed on the LED circuit board, and a thermal conductive sheet for receiving heat generated from the plurality of LEDs, wherein a thermal conductivity of the thermal conductive sheet in a surface direction is higher than a thermal conductivity in a thickness direction.

26 Claims, 6 Drawing Sheets

US 7,436,468 B2

LIQUID CRYSTAL DISPLAY HAVING AN LED AND A THERMAL CONDUCTIVE SHEET

CROSS-REFERENCE TO RELATED APPLICATION

This application claims priority to Korean Patent Application No. 2005-0025931, filed on Mar. 29, 2005, the disclosure of which is incorporated herein by reference.

BACKGROUND OF THE INVENTION

1. Technical Field

The present disclosure relates to a liquid crystal display (LCD), and more particularly, to an LCD using a light emitting diode (LED) as a light source.

2. Discussion of the Related Art

Flat panel displays, such as an LCD, a plasma display panel (PDP), and an organic light emitting diode (OLED), have been developed and have replaced a conventional display such as a cathode ray tube (CRT).

An LCD comprises a liquid crystal display panel having a TFT substrate, a color filter substrate, and liquid crystal disposed between the TFT substrate and the color filter substrate. Since the liquid crystal display panel cannot emit light by itself, the LCD may comprise a backlight unit disposed in rear of the TFT substrate. The transmittance of the light from the backlight unit is adjusted according to an alignment of liquid crystal. The liquid crystal display panel and the backlight unit are disposed in a chassis.

The backlight unit may be classified as an edge type and a direct type based on a location of a light source. The edge type backlight unit has the light source at the side of a light guiding plate and is used for a small-sized LCD such as a laptop or a desktop computer monitor. The edge type backlight unit is suitable for a thin LCD since the edge type backlight unit has a high light uniformity and endurance.

The direct type backlight unit can be used for larger LCDs and provides the entire surface of the LCD with light by disposing a plurality of light sources behind the liquid crystal display panel. The direct type backlight unit has a high brightness by using a plurality of light sources as compared with the edge type backlight unit. However, the brightness of the direct type backlight unit is not uniform.

An LED is used for a light source of a backlight unit since the LED has a high brightness and color reproducibility. The LED generates more heat than other light sources such as a Cold Cathode Fluorescent Lamp (CCFL) and an External Electrode Fluorescent Lamp (EEFL). The heat from the LED decreases the brightness of backlight and causes a color shift.

A radiating fin, a heat pipe and a cooling fan used to remove the heat from the LED cause the LCD to be heavier and thicker.

SUMMARY OF THE INVENTION

According to an embodiment of the present invention, an LCD comprises a liquid crystal display panel, an LED circuit board disposed behind the liquid crystal display panel, wherein a plurality of LEDs are disposed on the LED circuit board, and a thermal conductive sheet for receiving heat generated from the plurality of LEDs, wherein a thermal conductivity of the thermal conductive sheet in a surface direction is higher than a thermal conductivity in a thickness direction.

The thermal conductivity in the surface direction may be about 100 W/mK higher than the thermal conductivity in the thickness direction.

The thermal conductivity of the thermal conductive sheet in the surface direction may be higher than about 150 W/mK.

The thermal conductivity of the thermal conductive sheet in the thickness direction may be lower than about 10 W/mK.

The thermal conductive sheet may comprise graphite.

The LED circuit board and the thermal conductive sheet may be disposed in parallel with each other.

The LED may be disposed across an entire rear portion of the liquid crystal display panel.

The LCD may further comprise an upper chassis and a lower chassis housing the liquid crystal display panel and the LED circuit board, wherein the thermal conductive sheet is positioned on an external surface of the lower chassis.

The LCD may further comprise a gap pad disposed between the LED circuit board and the lower chassis, wherein the LED circuit board, the gap pad and the upper chassis are closely configured and are preferably adhered to each other.

The LCD may further comprise an upper chassis and a lower chassis housing the liquid crystal display panel and the LED circuit board, wherein the thermal conductive sheet is disposed between the LED circuit board and the lower chassis.

The LCD may further comprise a light guiding plate disposed at a rear of the liquid crystal display panel, wherein the LED circuit board is disposed along at least one side of the light guiding plate.

The LCD may further comprise an upper chassis and a lower chassis housing the liquid crystal display panel and the LED circuit board, wherein the thermal conductive sheet is positioned in parallel with the LED circuit board on an external surface of the lower chassis.

According to an embodiment of the present invention, an LCD comprises a liquid crystal display panel, an LED circuit board disposed behind the liquid crystal display panel, wherein a plurality of LEDs are disposed on the LED circuit board, and a thermal conductive sheet for transmitting heat from the plurality of LEDs substantially in a surface direction.

BRIEF DESCRIPTION OF THE DRAWINGS

Preferred embodiments of the present disclosure can be understood in more detail from the following description taken in conjunction with the accompanying drawings in which.

DETAILED DESCRIPTION OF THE PREFERRED EMBODIMENTS

Preferred embodiments of the present invention will be described below in more detail with reference to the accompanying drawings. The present invention may, however, be embodied in many different forms and should not be construed as limited to the embodiments set forth herein.

Figure 1:
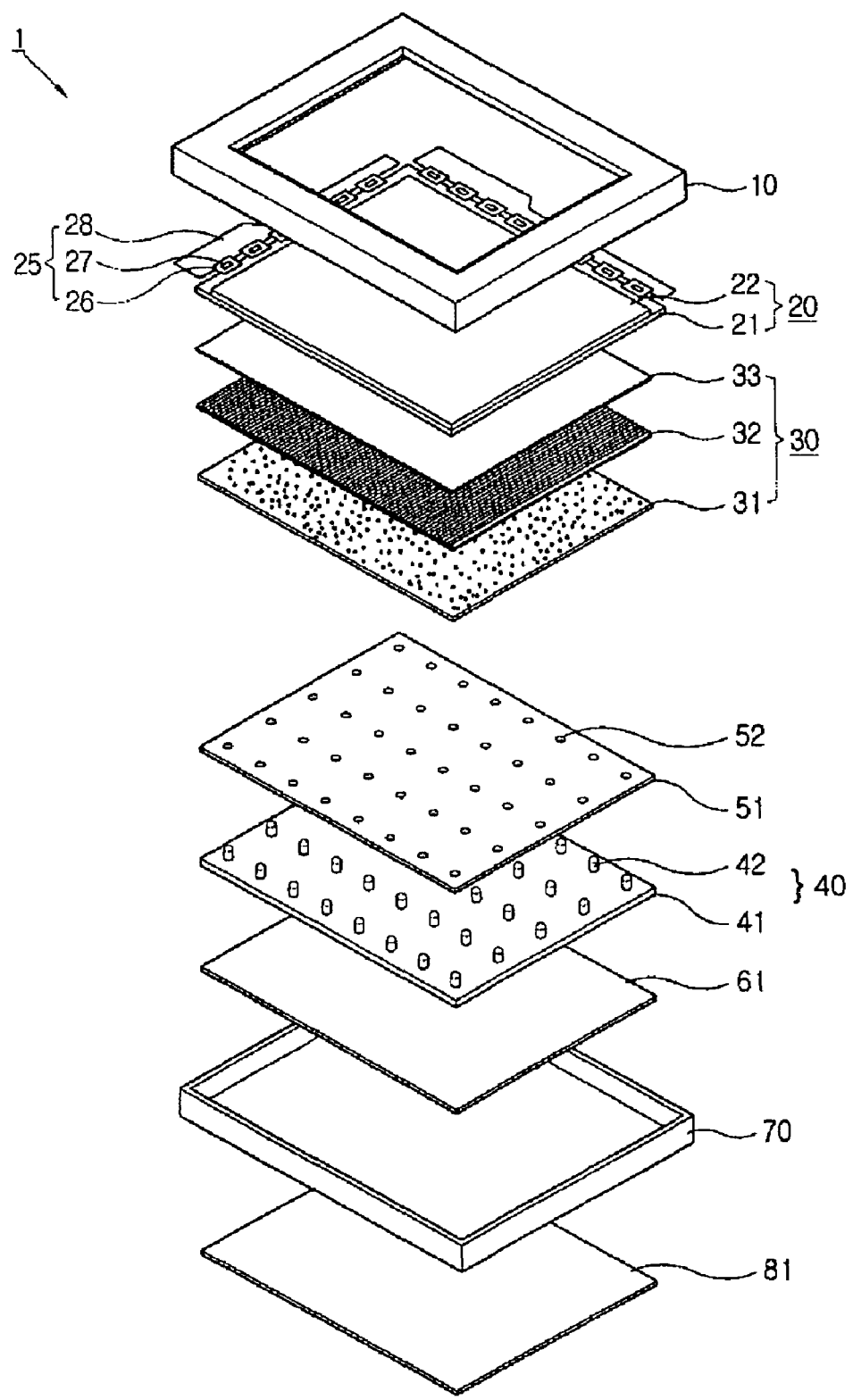
FIG. 1 is a perspective view of an LCD according to an embodiment of the present invention.
Figure 2:
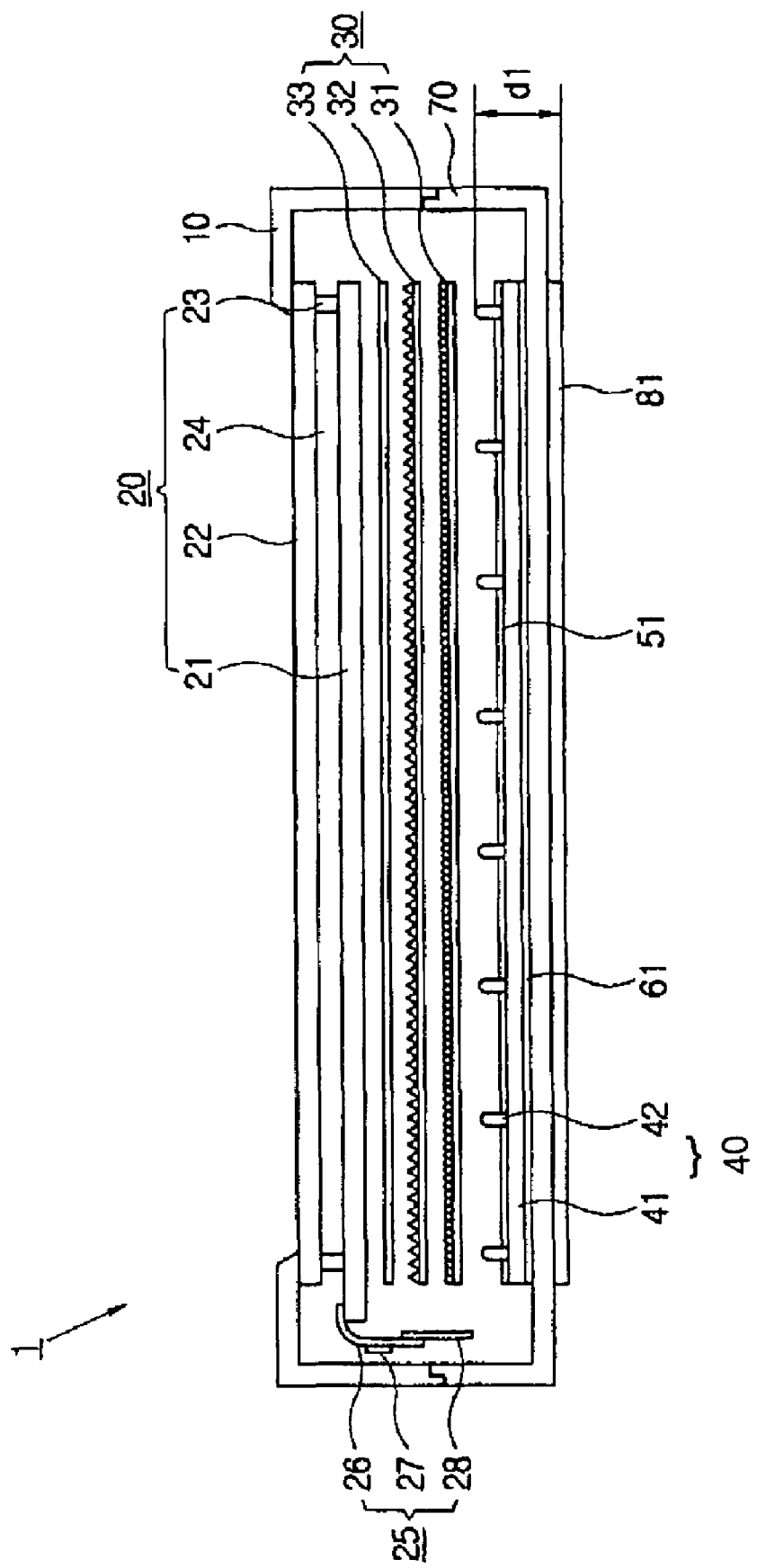
FIG. 2 is a sectional view of an LCD according to an embodiment of the present invention.

An embodiment of the present invention will be described referring to the FIGS. 1 and 2. A liquid crystal display 1 ("LCD") comprises a liquid crystal display panel 20, a light regulating part 30 disposed behind the liquid crystal panel 20, and an LED circuit board 41 disposed behind the light regulating part 30. A plurality of LEDs 42 are disposed on the LED circuit board 41.

The liquid crystal display panel 20, the light regulating part 30, and the LED circuit board 41 are disposed between an upper chassis 10 and a lower chassis 70. A thermal conductive sheet 81 is adhered to an external surface of the lower chassis 70.

The liquid crystal display panel 20 comprises a TFT substrate 21 on which a plurality of TFTs are formed, a color filter substrate 22 facing the TFT substrate 21, a sealant 23 adhering the two substrates 21 and 22 and forming a cell gap, and a liquid crystal layer 24 enclosed by the two substrates 21 and 22 and the sealant 23. The liquid crystal display panel 20 controls alignment of liquid crystal in the liquid crystal layer 24, thereby forming an image. The liquid crystal display panel 20 receives light from an LED light source part 40 disposed behind the liquid crystal display panel 20 since the liquid crystal display panel 20 cannot emit light by itself.

A driving part 25 providing driving signals is disposed on a side of the TFT substrate 21. The driving part 25 comprises a flexible printed circuit (FPC) 26, a driving chip 27 disposed on the flexible printed circuit 26, and a printed circuit board (PCB) 28 connected to a side of the flexible printed circuit 26. The driving part 25 shown in FIG. 1 is formed in a chip on film (COF) type substrate. Alternatively, a known technology such as, for example, tape carrier package (TCP) or a chip on glass (COG) can be used. The driving part 25 can be formed on the TFT substrate 21 while wirings are formed.

The light regulating part 30 disposed behind the liquid crystal display panel 20 may comprise a diffusion plate 31, a prism film 32 and a protection film 33. The diffusion plate 31 comprises a base plate and a coating layer. The coating layer includes beads formed on the base plate. Since the LED 42 is a point light source, an alignment of the plurality of LEDs 42 can be recognized by a user, and light uniformity can be lowered. The diffusion plate 31 diffuses light from the LED 42 to provide uniform brightness. A light block pattern having low transmittance can be formed on a region of the diffusion plate 31 on which the light from the LED 42 is most concentrated.

As a result, the alignment of the plurality of LEDs 42 is not noticed. A light guiding plate and a diffusion film may be used instead of the diffusion plate 31.

A triangular prism is placed on the prism film 32 in a predetermined alignment. The prism film 32 concentrates light diffused from the diffusion plate 31 in a direction perpendicular to a surface of the liquid crystal display panel 20. In an embodiment of the present invention, two prism films 32 are used, and micro prisms formed on the each prism film 32 form a predetermined angles with each other. The light passing through the prism film 32 progresses vertically for forming a uniform brightness distribution. In an embodiment of the present invention, a reflective polarizing film may be used along with the prism film 32. Alternatively, the reflective polarizing film may be used without the prism film 32.

The protection film 33, placed on top of the light regulating part 30, protects the prism film 32 from scratches.

The LED circuit board 41 is disposed across an entire rear portion of the liquid crystal display panel 20. The plurality of LEDs 42, disposed on the LED circuit board 41, are disposed across the entire rear portion of the liquid crystal display panel 20. According to an embodiment of the present invention, the plurality of LEDs 42 emitting each of red, blue and green colors can provide white color light to the liquid crystal display panel 20 by mixing the respective colors of light. Different arrangements of the respective colors of the plurality of LEDs 42 are available.

On a region of the LED circuit board 41 where the plurality of LEDs 42 are not disposed is disposed a reflective plate 51. A plurality of LED passing holes 52 are provided on the reflective plate 51 corresponding to the arrangement of the plurality of LEDs 42. The plurality of LEDs 42 are received by the LED passing holes 52. The reflective plate 51 reflects light delivered downward and the diffusion plate 31 receives the reflected light. The reflective plate 51 may comprise polyethylene terephthalate (PET) or polycarbonate (PC). According to an embodiment of the present invention, the reflective plate 60 is formed thick enough not to shrink due to heat generated from the LED 42.

A gap pad 61 is disposed between the LED circuit board 41 and the lower chassis 70. The gap pad 61 is a thin plate having a high thermal conductivity and is about 0.5 mm thick. The LED circuit board 41 and the lower chassis 70 comprising metal are adhered to each other by the gap pad 61.

A thermal conductive sheet 81 is adhered to an external surface of the lower chassis 70. The thermal conductive sheet 81 is disposed in parallel with the LED circuit board 41 and radiates heat generated from the plurality of LEDs 42 to the outside. The thermal conductive sheet 81 has two different thermal conductivities depending on a surface direction or a thickness direction. According to an embodiment of the present invention, a thermal conductivity of the thermal conductive sheet 81 in the surface direction may be about 100 W/mK higher than in the thickness direction. The thermal conductivity in the surface direction is preferably over about 150 W/mK. According to an embodiment of the present invention, the thermal conductivity in the thickness direction may be between about 6 W/mK and about 10 W/mK and in the surface direction may be between about 150 W/mK and about 500 W/mK. A thickness of the thermal conductive sheet 81 may be, but is not limited to, between about 0.08 mm and about 1.5 mm. The thermal conductive sheet 81 may comprise graphite. In an embodiment of the present invention, the thermal conductive sheet 81 may not comprise a filler or a binder. Spreadershield series of Graftech company can be used for the thermal conductive sheet 81.

The thermal conductive sheet 81 according to an embodiment of the present invention weighs about ⅓ less than a traditional aluminum radiation sheet and can be made thinner. Such a thermal conductive sheet 81 has a higher thermal conductivity in the surface direction than in the thickness direction, while the aluminum radiation sheet has the same thermal conductivity in every direction.

According to an embodiment of the present invention, an LED cooling efficiency is improved, although an interval d1 between the LED 42 and the thermal conductive sheet 81 is shortened as compared with a conventional LCD using a radiating fin and a cooling fan.

As mentioned in the above, heat is generated when the LED 42 is driven, and the heat is transmitted to the LED circuit board 41. Since the LED circuit board 41, the gap pad 61 and the lower chassis 70 are closely configured, and preferably adhered to each other, most of the heat is transmitted to the lower chassis 70. Since the LED 42 is a point light source, a plurality of hot spots are formed on the lower chassis 70. That is, the heat from the LED 42 is transmitted to the lower chassis 70 in the form of a spot.

Figure 3:
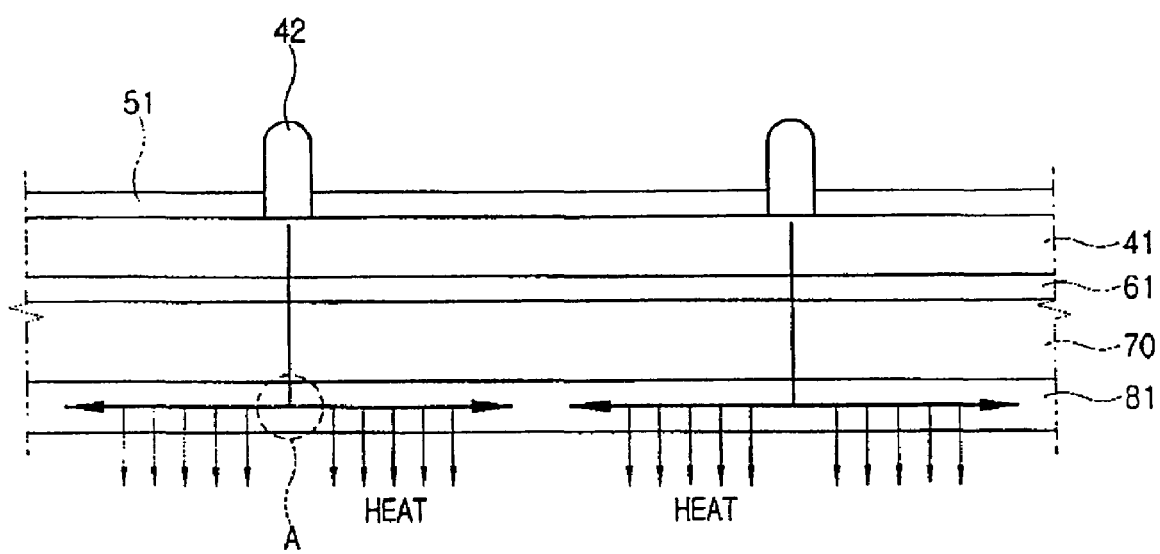
FIG. 3 is a drawing for describing cooling efficiency of an LCD according to an embodiment of the present invention.

Heat distributed on the lower chassis 70 in the form of a spot 70 is transmitted to the thermal conductive sheet 81 adhered on an external part of the lower chassis 70. Referring to FIG. 3, heat is transferred along a surface of the thermal conductive sheet 81 because the thermal conductivity in the surface direction is higher than in the thickness direction. Therefore, the heat may be distributed on the entire thermal conductive sheet 81, which increases an area contacting outside air. As a result, cooling efficiency increases.

When thermal conductivities between the thickness direction and the surface direction are similar, the heat generated from the LED 42 is concentrated on a region A of the thermal conductive sheet 81 below the LED 42. Since the region A on which the heat is concentrated is a local part of the thermal conductive sheet 81, area contacting outside air is limited. Therefore, the LED cooling is not efficient and a radiating fin or a cooling fan is needed to reduce or eliminate the heat concentrated on a part of the thermal conductive sheet 81.

Since heat from the LED 42 usually transfers along the surface direction of the thermal conductive sheet 81 accroding to an embodiment of the present invention, the area contacting outside air increases. Without using the radiating fin or the cooling fan, the LED 42 may be cooled efficiently when the thermal conductive sheet 81 is used. Therefore, the weight, the thickness and the noise of the LCD 1 may be decreased.

Figure 4:
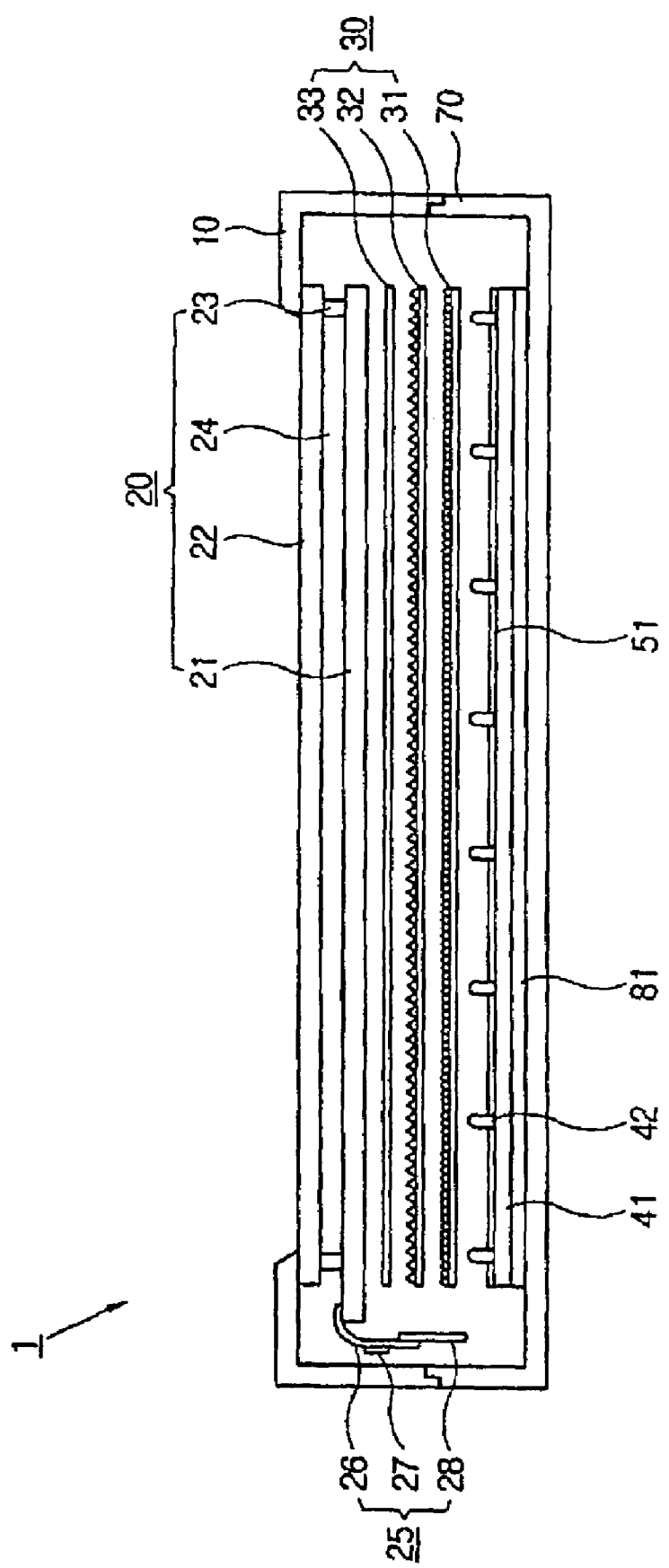
FIG. 4 is a sectional view of an LCD according to an embodiment of the present invention.

According to an embodiment of the present invention shown in FIG. 4, a thermal conductive sheet 81 of the LCD 1 is disposed between an LED circuit board 41 and a lower chassis 70. Since each of the LED circuit board 41 and the lower chassis 70 comprise metal, it is difficult to adhere the circuit board 41 and the lower chassis 70 to each other. Therefore, the LED circuit board 41 and the lower chassis 70 are adhered through the thermal conductive sheet 81. According to an embodiment of the present invention, the thermal conductive sheet 81 functions like the gap pad 61 as shown in FIG. 1. The thickness of the LCD according to an embodiment of the present invention becomes thinner since the gap pad 61 is not used.

Figure 5:
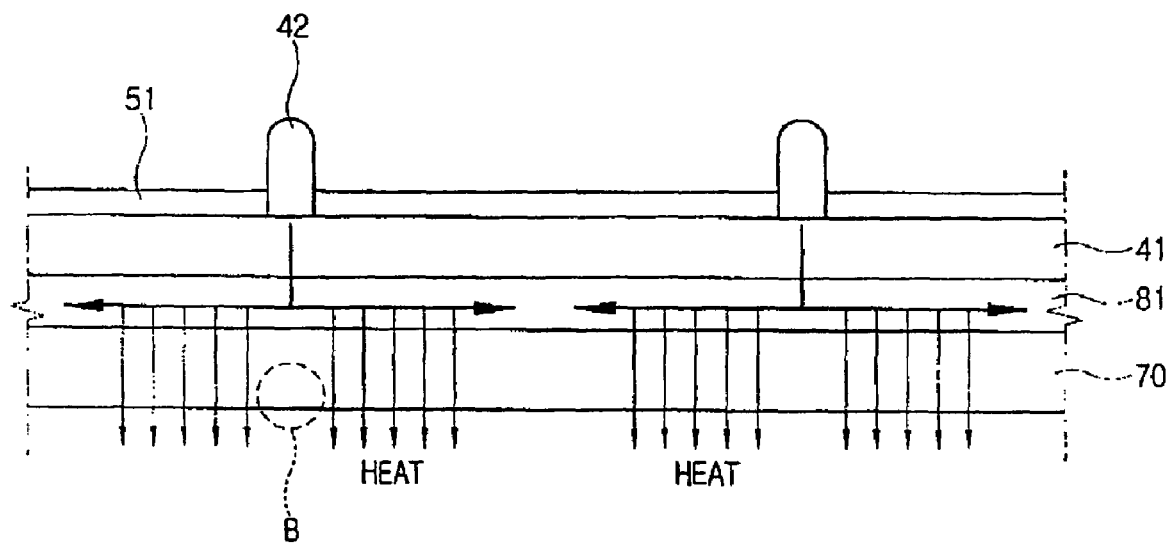
FIG. 5 is a drawing for describing cooling efficiency of an LCD according to an embodiment of the present invention.

As shown in FIG. 5, heat generated from the LED 42 is transmitted to the thermal conductive sheet 81 passing through the LED circuit board 41. In this case, heat is distributed on the thermal conductive sheet 81 in the form of a spot. The thermal conductive sheet 81 transmits heat transmitted from the LED 42 along the surface direction thereof, and the heat is transmitted to the entire surface of the lower chassis 70. The lower chassis 70 radiates the heat to the outside of the lower chassis 70 by contacting outside air. Heat is not partially concentrated on a region B of the lower chassis 70 below the LED 42 due to the thermal conductive sheet 81 transmitting heat along the surface direction.

An embodiment of the present invention will be described referring to FIG. 6. A light guiding plate 62 is disposed behind the light regulating part 30. A pair of LED circuit boards 41, on which the plurality of LEDs 42 are disposed, face each other and are disposed at each side of the light guiding plate 62. The light guiding plate 62 provides an entire surface of the liquid crystal panel 20 with the LED light supplied by the side thereof and comprises acryl resin. The LED circuit board 41 is disposed in a reflector 43. The thermal conductive sheet 81 is disposed in parallel with the LED circuit board 41 and positioned on the external side of the lower chassis 70. The thermal conductive sheet 81 may be extended to the rear portion of the lower chassis.

Figure 6:
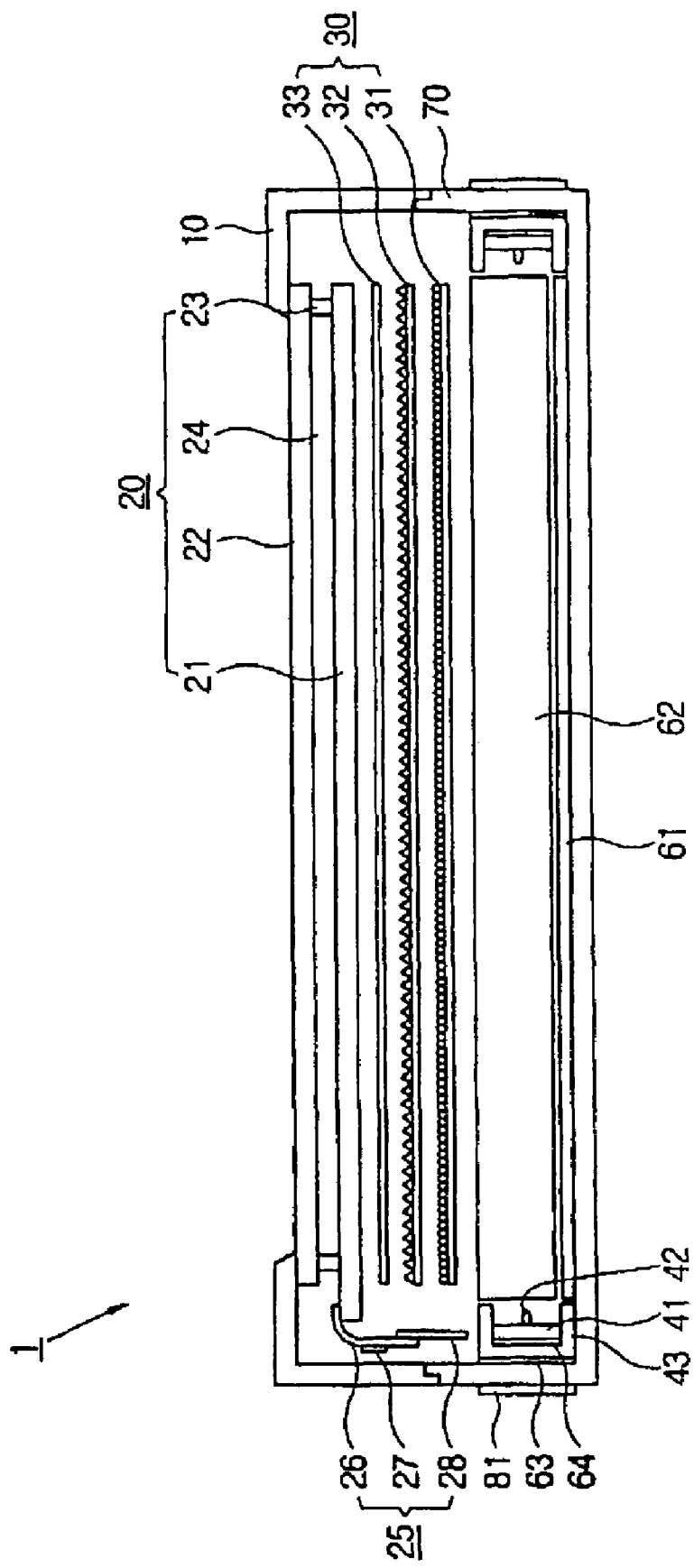
FIG. 6 is a sectional view of an LCD according to an embodiment of the present invention.

As shown in FIG. 6, the gap pads 63, 64 are interposed between the LED circuit board 41, the reflector 43 and the lower chassis 70. The heat generated from the LED 42 is transmitted to the thermal conductive sheet 81. The heat transmitted from the thermal conductive sheet 81 is transmitted along the surface direction and is radiated by contacting outside air.

According to embodiments of the present invention, the LEDs may be disposed in a 'U' or a 'D' shape. The form and number of the thermal conductive sheet 81 may be modified based on the alignment of the LEDs. To further improve the LED cooling efficiency, the thermal conductive sheet 81 can be used along with, for example, a radiating fin, a heat pipe, a cooling fan, and aluminum radiating board.

Although preferred embodiments have been described herein with reference to the accompanying drawings, it is to be understood that the present invention is not limited to these precise embodiments but various changes and modifications can be made by one skilled in the art without departing from the spirit and scope of the present invention. All such changes and modifications are intended to be included within the scope of the invention as defined by the appended claims.

What is claimed is:

1. A liquid crystal display comprising:
   a liquid crystal display panel;
   a light emitting diode circuit board disposed behind the liquid crystal display panel, wherein a plurality of light emitting diodes are disposed on the light emitting diode circuit board; and
   a thermal conductive sheet for receiving heat generated from the plurality of light emitting diodes, wherein a thermal conductivity of the thermal conductive sheet in a surface direction is higher than a thermal conductivity in a thickness direction.

2. The liquid crystal display according to claim 1, wherein the thermal conductivity in the surface direction is higher than the thermal conductivity in the thickness direction by 100 W/mk or more.

3. The liquid crystal display according to claim 1, wherein the thermal conductivity of the thermal conductive sheet in the surface direction is higher than about 150 W/mK.

4. The liquid crystal display according to claim 1, wherein the thermal conductivity of the thermal conductive sheet in the thickness direction is lower than about 10 W/mK.

5. The liquid crystal display according to claim 1, wherein a thickness of the thermal conductive sheet ranges between about 0.08 mm to about 1.5 mm.

6. The liquid crystal display according to claim 1, wherein the thermal conductive sheet comprises graphite.

7. The liquid crystal display according to claim 1, wherein the light emitting diode circuit board and the thermal conductive sheet are disposed in parallel with each other.

8. The liquid crystal display according to claim 1, wherein the plurality of light emitting diodes are disposed across an entire rear portion of the liquid crystal display panel.

9. The liquid crystal display according to claim 8, further comprising an upper chassis and a lower chassis housing the liquid crystal display panel and the light emitting diode circuit board, wherein the thermal conductive sheet is positioned on an external surface of the lower chassis.

10. The liquid crystal display according to claim 9, further comprising a gap pad disposed between the light emitting diode circuit board and the lower chassis, wherein the light emitting diode circuit board, the gap pad and the lower chassis are closely configured.

11. The liquid crystal display according to claim 8, further comprising an upper chassis and a lower chassis housing the liquid crystal display panel and the light emitting diode circuit board, wherein the thermal conductive sheet is disposed between the light emitting diode circuit board and the lower chassis.

12. The liquid crystal display according to claim 1, further comprising a light guiding plate disposed at a rear of the liquid crystal display panel, wherein the light emitting diode circuit board is disposed along at least one side of the light guiding plate.

13. The liquid crystal display according to claim 12, further comprising an upper chassis and a lower chassis housing the liquid crystal display panel and the light emitting diode circuit board, wherein the thermal conductive sheet is positioned in parallel with the light emitting diode circuit board on an external surface of the lower chassis.

14. A liquid crystal display comprising:
   a liquid crystal display panel;
   a light emitting diode circuit board disposed behind the liquid crystal display panel, wherein a plurality of light emitting diodes are disposed on the light emitting diode circuit board; and
   a thermal conductive sheet for transmitting heat from the plurality of light emitting diodes substantially in a surface direction.

15. The liquid crystal display according to claim 14, wherein a thermal conductivity of the thermal conductive sheet in the surface direction is higher than the thermal conductivity in the thickness direction by 100 W/mk or more.

16. The liquid crystal display according to claim 14, wherein the thermal conductivity of the thermal conductive sheet in the surface direction is higher than about 150 W/mK.

17. The liquid crystal display according to claim 14, wherein the thermal conductivity of the thermal conductive sheet in the thickness direction is higher than about 10 W/mK.

18. The liquid crystal display according to claim 14, wherein the thermal conductive sheet comprises graphite.

19. The liquid crystal display according to claim 14, wherein a thickness of the thermal conductive sheet ranges between about 0.08 mm to about 1.5 mm.

20. The liquid crystal display according to claim 14, wherein the light emitting diode circuit board and the thermal conductive sheet are disposed in parallel with each other.

21. The liquid crystal display according to claim 14, wherein the plurality of light emitting diodes are disposed across an entire rear portion of the liquid crystal display panel.

22. The liquid crystal display according to claim 21, further comprising an upper chassis and a lower chassis housing the liquid crystal display panel and the light emitting diode circuit board, wherein the thermal conductive sheet is attached to an external surface of the lower chassis.

23. The liquid crystal display according to claim 22, further comprising a gap pad disposed between the light emitting diode circuit board and the lower chassis, wherein the light emitting diode circuit board, the gap pad and the lower chassis are closely attached.

24. The liquid crystal display according to claim 21, further comprising an upper chassis and a lower chassis housing the liquid crystal display panel and the light emitting diode circuit board, wherein the thermal conductive sheet is disposed between the light emitting diode circuit board and the lower chassis.

25. The liquid crystal display according to claim 14, further comprising a light guiding plate disposed at a rear of the liquid crystal display panel, wherein the light emitting diode circuit board is disposed along at least one side of the light guiding plate.

26. The liquid crystal display according to claim 25, further comprising an upper chassis and a lower chassis housing the liquid crystal display panel and the light emitting diode circuit board, wherein the thermal conductive sheet is attached in parallel with the light emitting diode circuit board on an external surface of the lower chassis.

* * * * *